(12) United States Patent
Miyoshi et al.

(10) Patent No.: US 8,525,291 B2
(45) Date of Patent: Sep. 3, 2013

(54) SEMICONDUCTOR DEVICE (75) Inventors: Tomoyuki Miyoshi, Ome (JP); Shinichiro Wada, Fuchu (JP); Yohei Yanagida, Hamura (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/495,566

(22) Filed: Jun. 13, 2012

(65) Prior Publication Data
US 2012/0256291 A1    Oct. 11, 2012

Related U.S. Application Data (62) Division of application No. 12/505,581, filed on Jul. 20, 2009, now Pat. No. 7,217,425.

(30) Foreign Application Priority Data

Sep. 29, 2008 (JP) ................................ 2008-249506

(51) Int. Cl.
*H01L 27/08* (2006.01)
(52) U.S. Cl.
USPC .......................................... 257/506; 257/509

(58) Field of Classification Search
USPC ...................... 257/506–510, E27.051
See application file for complete search history.

(56) References Cited

U.S. PATENT DOCUMENTS

| 5,859,552 | A | 1/1999 | Do et al. |
| 6,002,158 | A * | 12/1999 | Yanagigawa .................. 257/492 |
| 7,132,347 | B2 | 11/2006 | Himi et al. |
| 7,177,707 | B2 | 2/2007 | Lam |
| 8,324,691 | B2 * | 12/2012 | Hirose et al. .................. 257/378 |
| 2006/0214693 | A1 | 9/2006 | Nakano |

FOREIGN PATENT DOCUMENTS

JP    2006-269835 A    10/2006

* cited by examiner

*Primary Examiner* — Cuong Q Nguyen
(74) *Attorney, Agent, or Firm* — Miles & Stockbridge P.C.

(57) ABSTRACT

The cell size is reduced and device reliability is improved for a semiconductor device including plural transistors making up a multi-channel output circuit. In a multi-channel circuit configuration, a group of transistors having a common function of plural channels are surrounded by a common trench for insulated isolation from another group of transistors having another function. The collectors of mutually adjacent transistors on the high side are commonly connected to a VH power supply, whereas the emitters of mutually adjacent transistors on the low side are commonly connected to a GND power supply.

3 Claims, 10 Drawing Sheets

FIG. 13

SEMICONDUCTOR DEVICE

CROSS REFERENCE TO RELATED APPLICATIONS

This application is a division of application Ser. No. 12/505,581 filed Jul. 20, 2009 now U.S. Pat. No. 8,217,425. The present application also claims priority from Japanese patent application JP 2008-249506 filed on Sep. 29, 2008, the content of which is hereby incorporated by reference into this application.

FIELD OF THE INVENTION

The present invention relates to a semiconductor device, for example, one which can be effectively applied to a circuit device like a scan driver IC (hereinafter referred to as a "scan IC") for a plasma display panel including upper and lower arms and having a multi-channel output function.

BACKGROUND OF THE INVENTION

There have been semiconductor devices in which two groups of transistors are enclosed in two element isolation areas, respectively, for isolation from each other with the sources of the transistors connected to a common power supply and the transistors mutually connected in parallel (see JP-A No. 2006-269835, for example).

SUMMARY OF THE INVENTION

Figure 1:
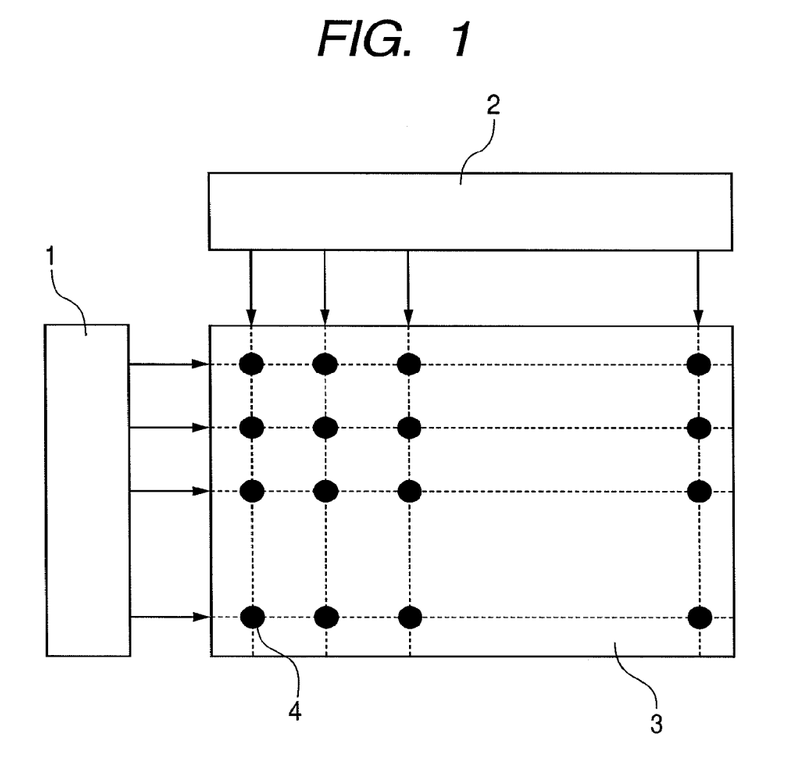
FIG. 1 is a configuration diagram of an IC for driving an AC type PDP.

FIG. 1 illustrates a drive system for a plasma display panel (hereinafter referred to as a "PDP"). Generally, a PDP is driven by a scan IC and an address driver IC. Both drivers have a multi-stage bit configuration, and their drive signals light cells of the PDP corresponding to their bits to display an image on the PDP.

Figure 2:
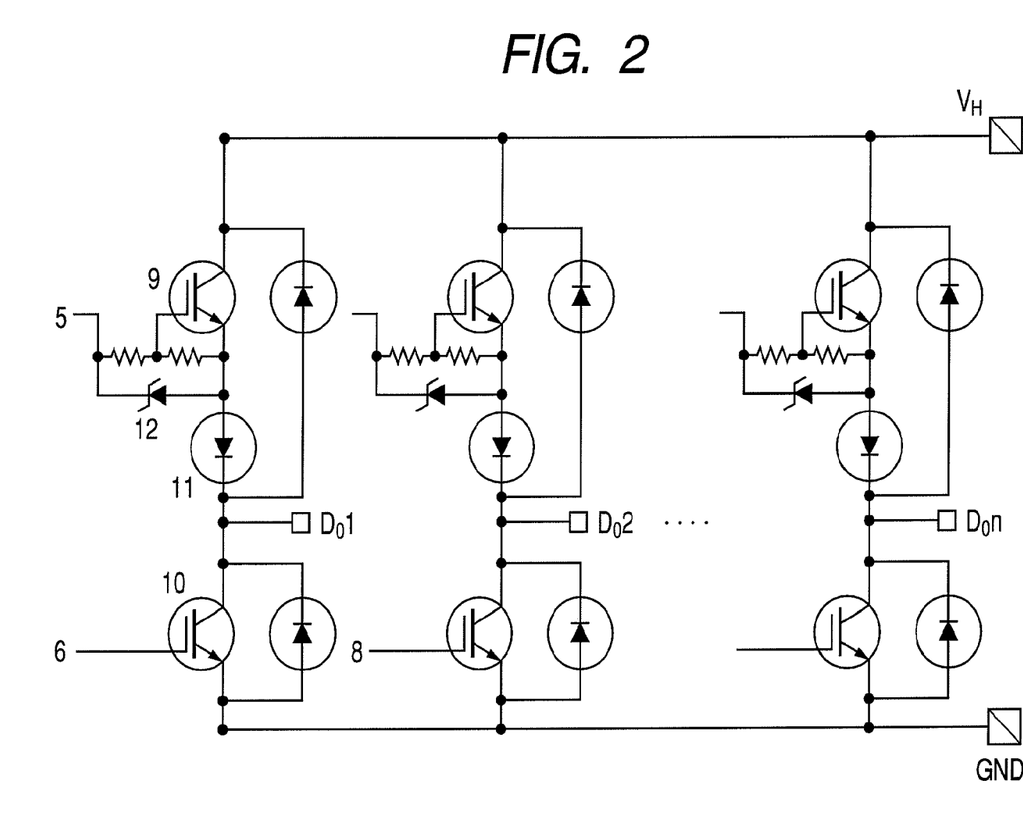
FIG. 2 is an output circuit diagram of an IC for driving an AC type PDP.

FIG. 2 is an output circuit diagram of a one-bit portion of a scan IC. The circuit includes high-voltage, lateral insulated gate bipolar transistors and diodes. $V_H$ denotes a load power supply, $D_o$ denotes an output terminal, and GND denotes a ground terminal. The scan IC includes the output circuits for, for example, 64 bits.

Figure 3:
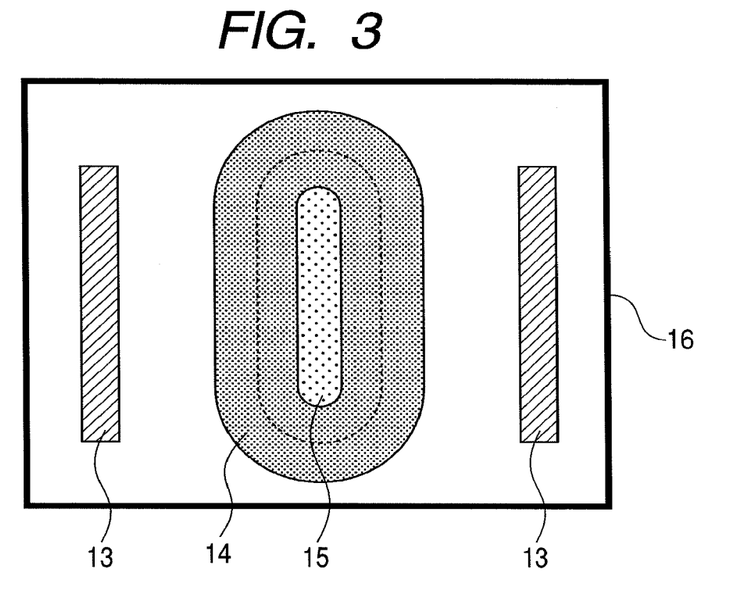
FIG. 3 is a partial plan view of a lateral insulated gate bipolar transistor.
Figure 4:
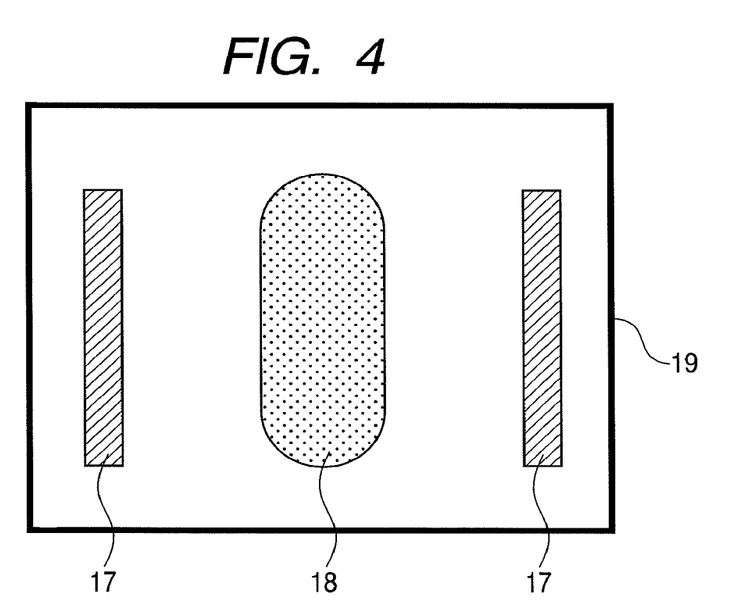
FIG. 4 is a partial plan view of a high-voltage diode.
Figure 5:
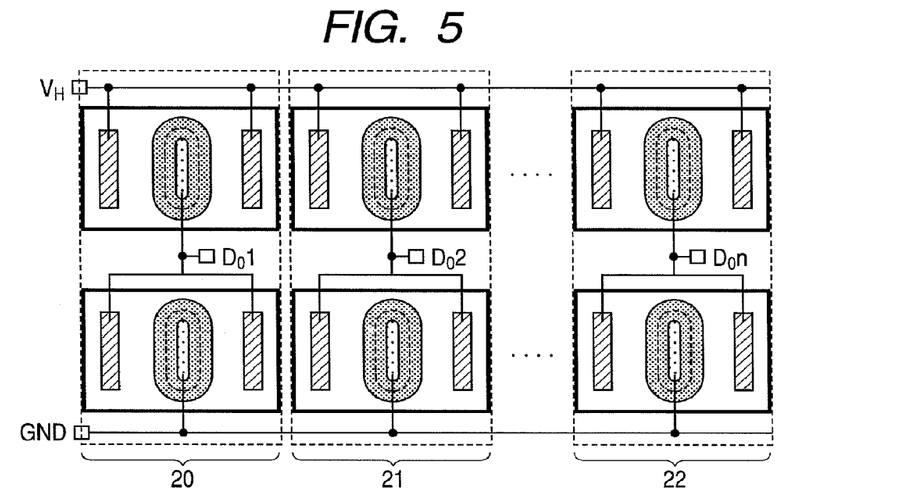
FIG. 5 is a partial plan view of a lateral insulated gate bipolar transistor included in an output circuit.
Figure 6:
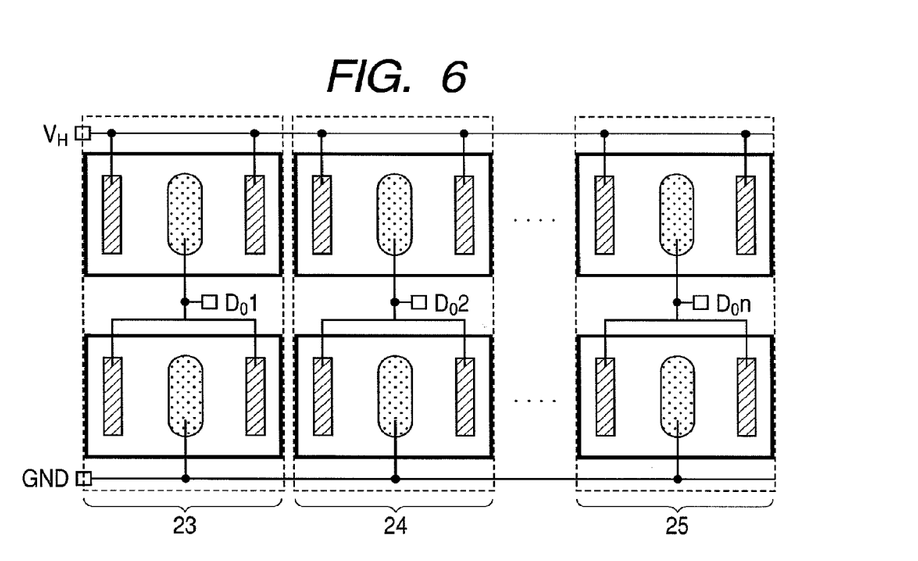
FIG. 6 is a partial plan view of a high voltage diode included in an output circuit.

FIGS. 3 and 4 are plan views, FIG. 3 showing a lateral insulated gate bipolar transistor and FIG. 4 showing a diode both included in the scan IC circuit. The lateral insulated gate bipolar transistors and diodes included in the scan IC circuit are each enclosed, as shown in FIGS. 5 and 6, in a trench isolation structure for channel-by-channel element isolation.

Making an IC chip smaller is effective in reducing the cost of the IC. For an IC which, like a scan IC, includes a multi-channel output circuit, reducing the transistor size per channel produces a great effect for reducing the chip size. Reducing the size of a lateral insulated gate bipolar transistor by reducing the distances between its emitter and collectors, however, also reduces the voltage resistance of the transistor. Similarly, reducing the distances between its collector regions and the isolation trench isolating the transistor also reduces the voltage resistance of the transistor.

The above also applies to diodes. Since making lateral insulated gate bipolar transistors and diodes smaller decreases the voltage resistance of such elements, there is a limit to reducing the chip size.

When a large current is applied, for example, by an output driver to elements each isolated by an insulating film with low thermal conductivity, the current density in the elements increases. Namely, when the elements are operated, they may fail due to heat generation.

Among known semiconductor devices each including two transistor groups enclosed in two element isolation areas, respectively, for isolation from each other, there are those in which the transistors are mutually connected in parallel with their sources connected to a common power supply as described in JP-A No. 2006-269835, for example.

There has been, however, no device configuration in which a first group (e.g. on the high side) of elements and a second group (e.g. on the low side) of elements are, like elements (transistors or high-voltage diodes) of a high-voltage output-stage circuit, series-connected for the first through n-th channels, respectively, and in which the first element group and the second element group are each enclosed in an element isolation structure for isolation from each other.

An object of the present invention is to provide a semiconductor device which enables both chip size reduction and improvement of heat radiation performance of elements in operation.

A typical example of the present invention is as follows.

A semiconductor device according to the present invention includes a plurality of channels. In the semiconductor device, a group of elements having a common function of the plurality of channels are enclosed in a common element isolation structure for insulated isolation from another group of elements. The another group of elements have another function and are enclosed in another element isolation structure.

To be more concrete, a semiconductor device according to the present invention includes a first group of transistors of a plurality of channels and a second group of transistors of a plurality of channels. The first group of transistors are enclosed in a common first element isolation structure and are each laid out such that an emitter is positioned between collectors. The second group of transistors are enclosed in a common second element isolation structure and are each laid out such that a collector is positioned between emitters. In the semiconductor device, emitters of the first group of transistors and collectors of the second group of transistors are commonly connected to an output terminal.

According to the present invention, the chip size can be reduced and heat radiation performance can be improved for a semiconductor device to thereby improve the reliability of the semiconductor device.

DETAILED DESCRIPTION OF THE PREFERRED EMBODIMENTS

Typical aspects of the present invention are briefly described below.

In a multi-channel circuit configuration: each group of transistors having a common function are surrounded by a common trench for isolation; and the collectors of mutually adjacent transistors on the high side are commonly connected to a VH power supply, whereas the emitters of mutually adjacent transistors on the low side are commonly connected to a GND power supply.

In the above configuration, mutually adjacent transistors can share a common collector region and can be enclosed in a common trench isolation area. This makes it possible to reduce the element size per channel by removing or reducing the distances between adjacent trenches, the widths of trenches belonging to two adjacent device regions, and the distances between trenches and collectors.

A semiconductor device according to the present invention has a multi-channel configuration: In the multi-channel configuration, a group of elements having a common function of plural channels are enclosed in a common element isolation structure for insulated isolation from another group of elements having another function and being enclosed in another element isolation structure.

The group of elements may be, though not limited to, a group of transistors or a group of diodes.

Example aspects of the present invention in cases where the group of elements is a group of transistors are described below.

The collector (or drain) regions of the group of transistors enclosed in a common element isolation structure may be connected to common first potential wiring. In this case, the group of transistors of mutually adjacent channels can share a common collector (or drain) region.

Or, the emitter (or source) regions of the group of transistors enclosed in the common element isolation structure may be connected to common second potential wiring, the second potential being lower than the first potential. In this case, the group of transistors of mutually adjacent channels can share a common emitter (or source) region.

The element isolation structure is preferably a trench isolation structure having a trench formed in a closed curve enclosing elements to be isolated from outside regions.

The group of transistors may include lateral insulated gate bipolar transistors or field effect transistors.

Example aspects of the present invention in cases where the group of elements is a group of diodes are described below.

The cathode regions of the group of diodes enclosed in a common element isolation structure may be connected to common first potential wiring. In this case, the group of diodes of mutually adjacent channels can share a common cathode region.

Or, the anode regions of the group of diodes enclosed in the common element isolation structure may be connected to common second potential wiring, the second potential being lower than the first potential. In this case, the group of diodes of mutually adjacent channels can share a common anode region.

Embodiments of the present invention will be described in detail below with reference to drawings. Even though the semiconductor devices of the following embodiments are formed on silicon-on-insulator (SOI) substrates, the present invention can also be applied to semiconductor devices formed on bulk substrates.

The following embodiments are applied to a group of insulated gate bipolar transistors or field effect transistors having a common function in a semiconductor device of a multi-channel configuration. The present invention can also be applied to a group of diodes making up plural channels and having a common function.

Preferred embodiments of a semiconductor device according to the present invention will be individually described in the following with reference to drawings.

First Embodiment

Figure 7:
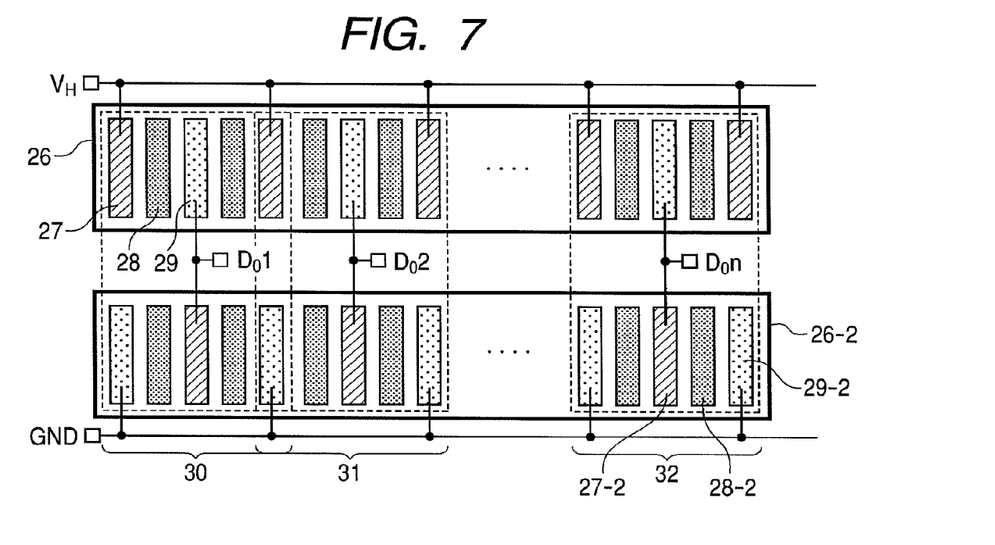
FIG. 7 is a partial plan view of a transistor according to a first embodiment of the present invention.

FIG. 7 is a partial plan view showing transistor groups according to a first embodiment of the present invention. Referring to FIG. 7, a first and a second transistor group included in a multi-channel circuit configuration each include transistors having a common function and are each surrounded by a common trench. In the first group on the high side, the collector (drain/cathode) regions of transistors of mutually adjacent channels are commonly connected to a VH power supply. In the second group on the low side, the emitter (source/anode) regions of transistors of mutually adjacent channels are commonly connected to a GND power supply.

The plural transistors of the first group inside a first element isolation area 26 surrounded by, for example, a U-shaped trench include collector (or drain) regions 27, gate regions 28, and emitter (or source) regions 29, and have a common function for the high side, i.e. the positive potential side, of a high-voltage device. The plural transistors of the second group inside a second element isolation area 26-2 surrounded by, for example, a U-shaped trench include collector (or drain) regions 27-2, gate regions 28-2, and emitter (or source) regions 29-2, and have a common function for the low side, i.e. the ground (GND) potential side, of the high-voltage device. Thus, transistors having a common function are enclosed in a common element isolation area, that is, different groups of transistors having different functions are enclosed in different element isolation areas for mutual isolation between groups.

The transistors on the high side of mutually adjacent channels share common collector (or drain) regions 27 connected to the positive potential power supply VH. The transistors on the low side of mutually adjacent channels share common emitter (or source) regions 29-2 connected to the ground potential power supply GND.

Figure 8:
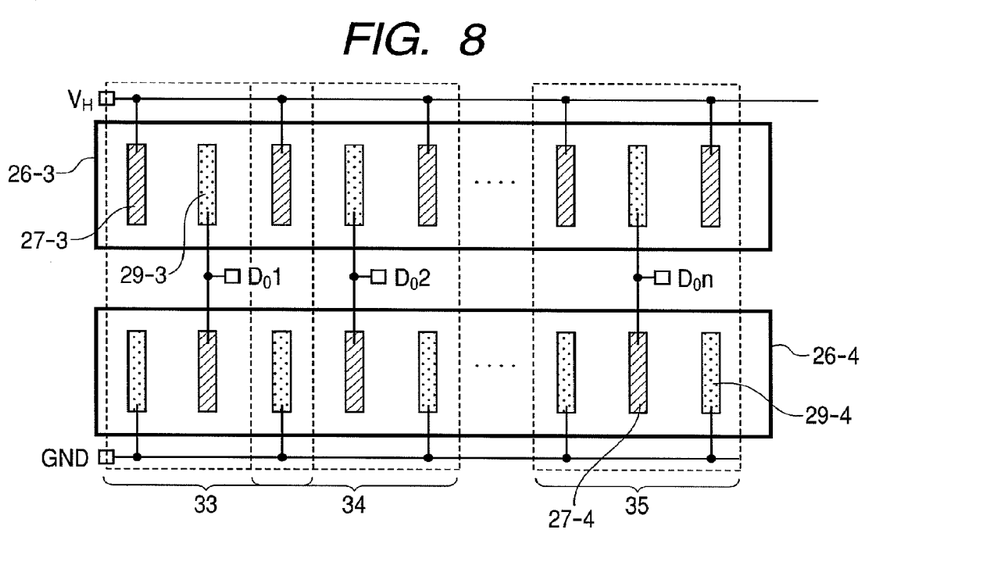
FIG. 8 is a partial plan view of a high voltage diode according to the first embodiment of the present invention.

In each of the first transistor group enclosed in the first element isolation area 26 and the second transistor group enclosed in the second element isolation area 26-2, the transistors are arranged in a one-dimensional order of transistor 30 of a first channel of an output stage circuit, transistor 31 of a second channel of the output stage circuit, . . . , transistor 32 of an n-th channel of the output stage circuit. FIG. 8 is a partial plan view showing diode groups according to the first embodiment of the present invention. Referring to FIG. 8, a first and a second diode group included in a multi-channel circuit configuration each include diodes having a common function and are each surrounded by a common trench. In the first group on the high side, the cathode regions of diodes of mutually adjacent channels are commonly connected to a VH power supply. In the second group on the low side, the anode regions of diodes of mutually adjacent channels are commonly connected to a GND power supply.

The plural diodes of the first group inside a first element isolation area 26-3 surrounded by, for example, a U-shaped trench, include cathode regions 27-3 and anode regions 29-3, and have a common function for the high side, i.e. the positive potential side, of a high-voltage device. The plural diodes of the second group inside a second element isolation area 26-4 surrounded by, for example, a U-shaped trench, include cathode regions 27-4 and anode regions 29-4, and have a common function for the low side, i.e. the ground (GND) potential side, of the high-voltage device. Thus, diodes having a common function are enclosed in a common element isolation area, that is, different groups of diodes having different functions are enclosed in different element isolation areas for mutual isolation between groups.

The diodes on the high side of mutually adjacent channels share common cathode regions 27-3 connected to the positive potential power supply VH. The diodes on the low side of mutually adjacent channels share common anode regions 29-4 connected to the ground potential power supply GND.

In each of the first diode group enclosed in the first element isolation area 26-3 and the second diode group enclosed in the second element isolation area 26-4, the diodes are arranged in a one-dimensional order of diode 33 of a first channel of an output stage circuit, diode 34 of a second channel of the output stage circuit, . . . , diode 35 of an n-th channel of the output stage circuit.

According to the present embodiment, a first group of elements inside a first common element isolation area share common collector (drain/cathode) regions for mutually adjacent channels, whereas a second group of elements inside a second common element isolation area share common emitter (source/anode) regions. In this configuration, compared with existing configurations in which elements are each isolated by a U-shaped trench, all transistors having a common function for making up channels are surrounded by a common U-shaped trench, so that the elements can be made smaller and so that the heat radiation performance of the device can be improved.

Second Embodiment

Figure 9:
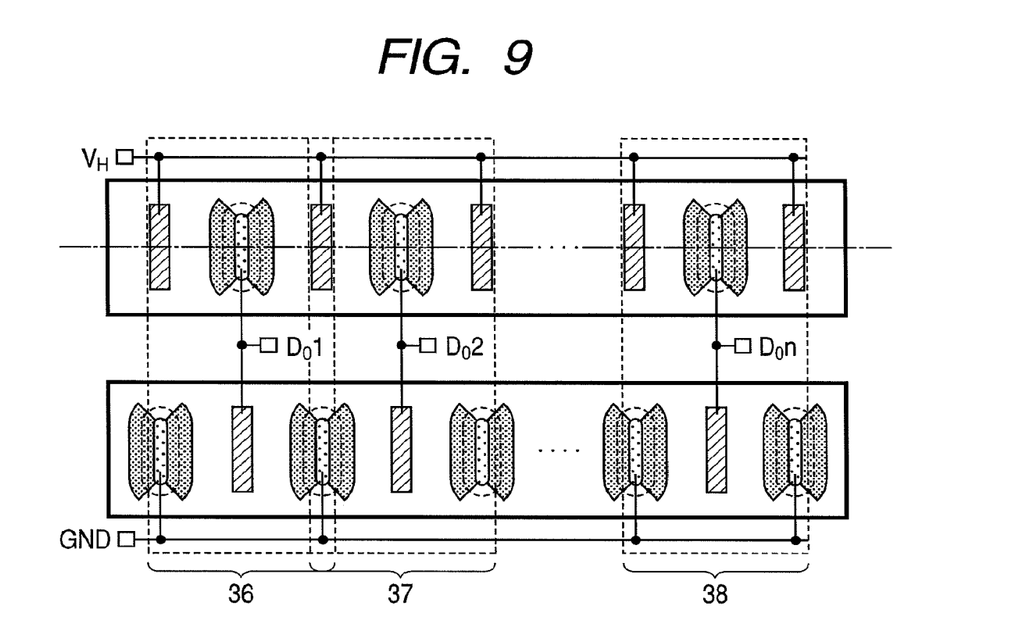
FIG. 9 is a partial plan view of a lateral gate bipolar transistor according to a second embodiment of the present invention.
Figure 10A:
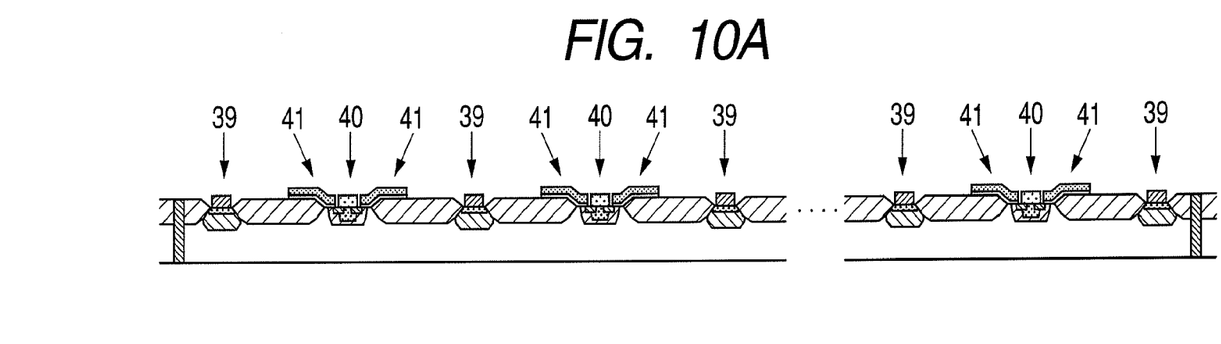
FIG. 10A is a partial sectional view of the lateral gate bipolar transistor according to the second embodiment of the present invention.
Figure 10B:
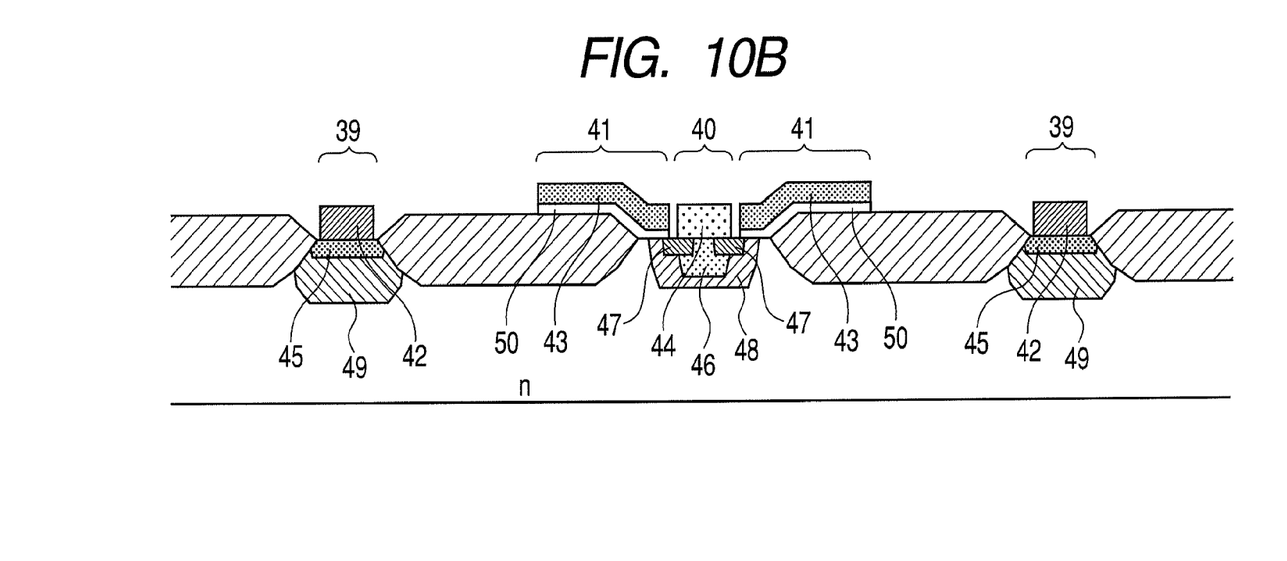
FIG. 10B is an enlarged sectional view of a portion of the section shown in FIG. 10A.

FIGS. 9, 10A, and 10B illustrate, as an embodiment of a semiconductor integrated circuit device according to the present invention, lateral insulated gate bipolar transistors in an output circuit. FIG. 9 is a partial plan view. FIG. 10A is a sectional view corresponding to FIG. 9. FIG. 10B is an enlarged sectional view of a portion of the section shown in FIG. 10A. One each output terminal $D_o$ is led from between each pair of series-connected transistors. The elements connected to a power supply terminal $V_H$ are referred to as source elements. The elements connected to a ground terminal GND are referred to as sink elements.

The sectional structure of each lateral insulated gate bipolar transistors shown in FIGS. 10A and 10B is of an n-channel type. To form a lateral insulated gate bipolar transistor, a p-base region is selectively formed on a surface layer of an n-type semiconductor substrate. Two n-emitter regions are formed on a part of the surface layer of the p-base region. A p-contact region is formed between the two n-emitter regions such that it partly overlaps with the two n-emitter regions. N-buffer regions are selectively formed on surface parts exposed where no p-base region is formed of the n-type substrate. A p-collector region is formed on the surface layer of each of the n-buffer regions. On the surface of a channel region provided on the surface layer of the p-base region between an exposed surface part of the n-type substrate and the n-emitter regions, a gate electrode to be connected to a G terminal via a gate oxide film is formed. An emitter electrode is formed to contact the surfaces of the n-emitter regions and p-contact region and is connected to an E terminal. A collector electrode is formed on the surface of the p-collector region and is connected to a C terminal. Referring to FIGS. 10A and 10B, each region including a p-base region and structures formed thereon is referred to as an emitter-gate region, and each region including an n-buffer region and structures formed thereon is referred to as a collector region. The elements used in the present embodiment are laid out such that a pair of collector regions are provided symmetrically about each emitter/gate region.

In the above configuration, compared with existing configurations in which different transistors of different channels are each surrounded by a U-shaped trench, plural insulated gate bipolar transistors share common collector regions for mutually adjacent channels and the insulated gate bipolar transistors having a common function are surrounded by a common U-shaped trench. This configuration, compared with existing configurations, makes it possible to reduce the layout size per channel. Also, mutually adjacent collectors are formed as common collectors to share a power supply with lower-arm emitters, so that the wiring length can be reduced by shifting the cell position. In this configuration, unlike in existing configurations in which individual elements are each surrounded by a trench, plural elements are surrounded by a common trench. This makes it possible to reduce the heat resistance of the device and improve its heat radiation performance. Hence, element destruction resulting from heat generation by elements can be reduced to improve device reliability. Furthermore, in the configuration of the present embodiment, lateral gate bipolar transistors used as source elements and those used as sink elements may be laid out identically so that they may have identical characteristics and identical voltage resistance.

Third Embodiment

Figure 11:
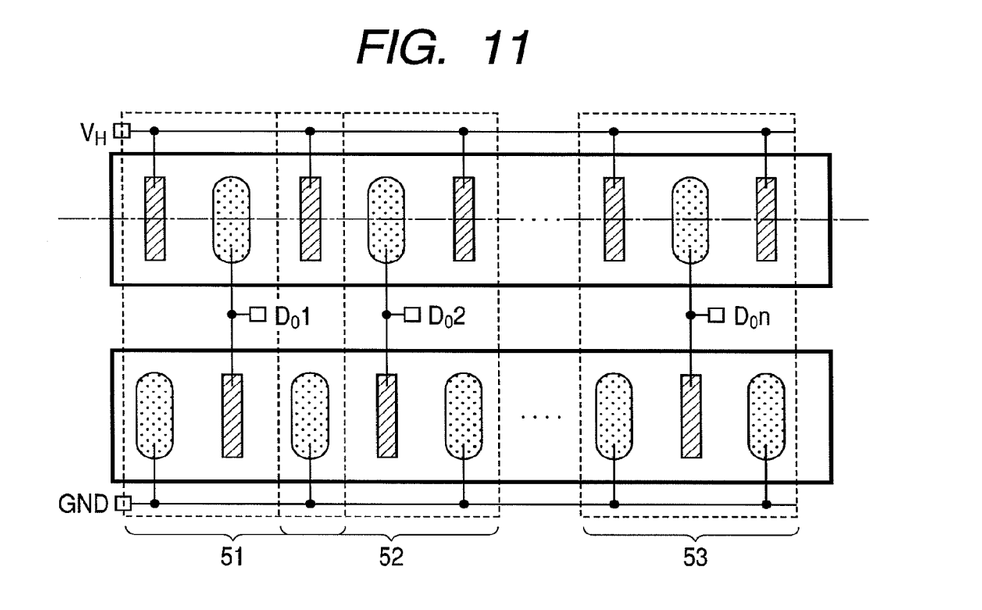
FIG. 11 is a partial plan view of a high voltage diode according to a third embodiment of the present invention.
Figure 12A:
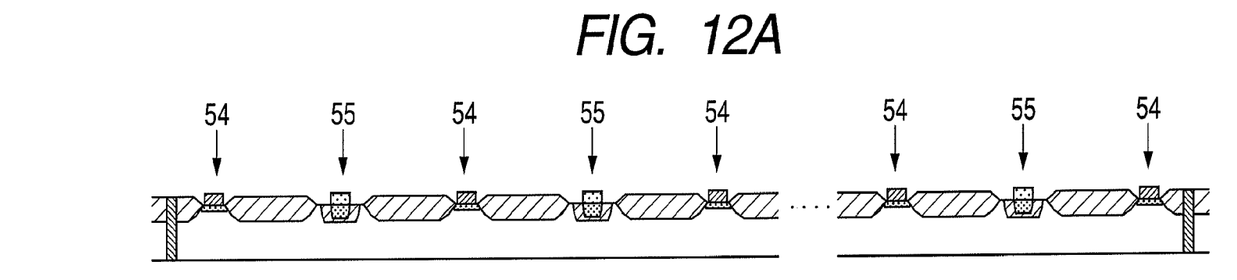
FIG. 12A is a partial sectional view of the high voltage diode according to the third embodiment of the present invention.
Figure 12B:
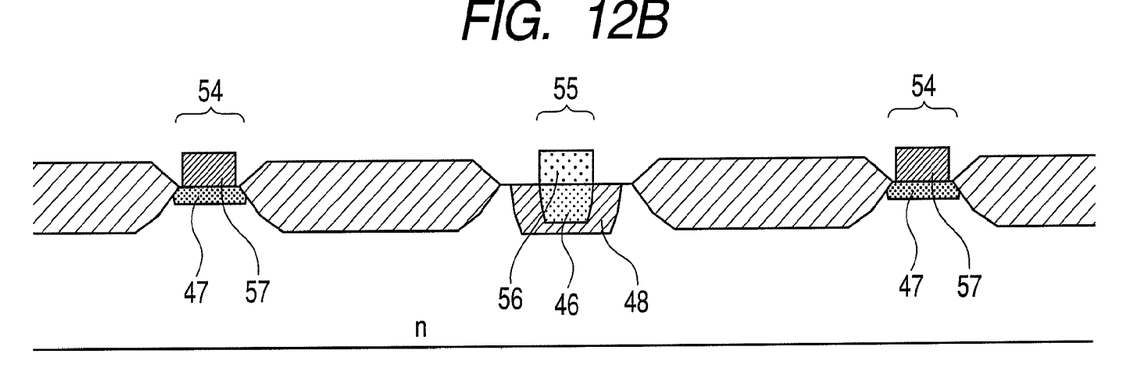
FIG. 12B is an enlarged sectional view of a portion of the section shown in FIG. 11A.

FIGS. 11, 12A, and 12B illustrate, as an embodiment of a semiconductor integrated circuit device according to the present invention, diodes in an output circuit. FIG. 11 is a partial plan view. FIG. 12A is a sectional view corresponding to FIG. 11. FIG. 12B is an enlarged sectional view of a portion of the section shown in FIG. 12A. One each output terminal $D_o$ is led from between each pair of series-connected diodes. The elements connected to a power supply terminal $V_H$ are referred to as source elements. The elements connected to a ground terminal GND are referred to as sink elements.

The sectional structure of each of the diodes includes a p-anode region selectively formed on a surface layer of an n-type semiconductor substrate with a p-contact region formed on apart of the surface layer of the p-anode region. N-contact regions are selectively formed on surface parts exposed where no p-anode region is formed of the n-type substrate. An anode electrode is formed to contact the surface of the p-contact region. A cathode electrode is formed on the surface of each of the n-contact regions. The anode electrode and the cathode electrode are connected to an A terminal and a K terminal, respectively. Referring to FIGS. 12A and 12B, each region including a p-contact region and structures formed thereon is referred to as an anode region, and each region including an n-contact region and structures formed thereon is referred to as a cathode region. The elements used in the present embodiment are laid out such that a pair of cathode regions are provided symmetrically about each anode region.

In the above configuration, compared with existing configurations in which each element is surrounded by a U-shaped trench, plural diodes share common cathode regions for mutually adjacent channels and all diodes having a common function are surrounded by a common U-shaped trench. This configuration, compared with existing configurations, makes it possible to reduce the device size per channel by removing or reducing the distances between adjacent trenches, the widths of trenches belonging to two adjacent device regions, the distances between trenches and cathode regions, and the widths of cathode regions. In this configuration, unlike in existing configurations in which individual elements are each surrounded by a trench, plural elements are surrounded by a common trench. This makes it possible to reduce the heat resistance of the device and improve its heat radiation performance. Furthermore, in the configuration of the present embodiment, a same basic layout may be applied to diodes used as source elements and diodes used as sink elements so that they may have identical characteristics and identical voltage resistance.

Fourth Embodiment

Figure 13:
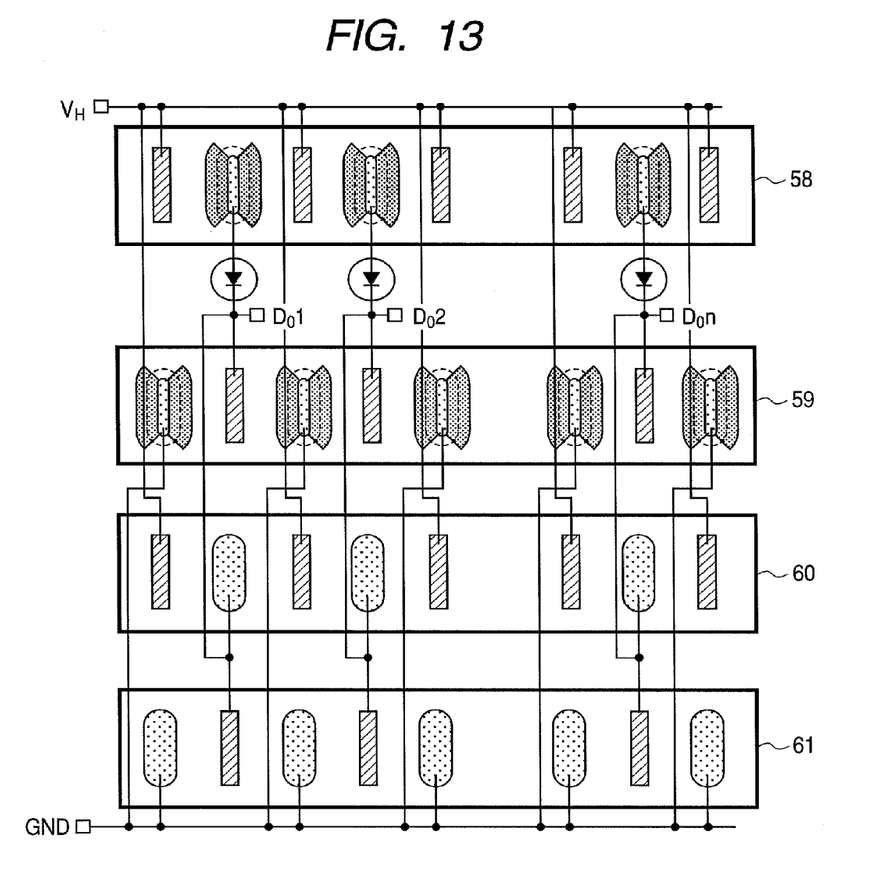
FIG. 13 is a partial plan view of an output circuit of a scan IC according to a fourth embodiment of the present invention.

FIG. 13 is a layout diagram illustrating an embodiment of a layout configuration of a scan IC circuit using a semiconductor device according to the present invention. In the configuration: a group of lateral insulated gate bipolar transistors included in a source section (high side) of an output stage circuit are formed inside a common element isolation structure 58 for isolation from the other regions; a group of lateral insulated gate bipolar transistors included in a sink section (low side) of the output stage circuit are formed inside a common element isolation structure 59 for isolation from the other regions; a group of high-voltage diodes included in a source section (high side) of the output stage circuit are formed in a common element isolation structure 60 for isolation from the other regions; and a group of high-voltage diodes included in a sink section (low side) of the output stage circuit are formed in a common element isolation structure 61 for isolation from the other regions. Thus, the four groups of elements are included in the four element isolation structures 58, 59, 60, and 61, respectively, for mutual isolation.

The collectors of the lateral insulated gate bipolar transistors on the high side and the cathodes of the high-voltage diodes on the high side are commonly connected to a prescribed first potential VH. The emitters of the lateral insulated gate bipolar transistors on the low side and the anodes of the high-voltage diodes on the low side are commonly connected to a prescribed second potential which is lower than the first potential. The first potential may be a prescribed positive potential, and the second potential may be a ground potential GND, but the present invention is not limited to them.

The emitters of the lateral insulated gate bipolar transistors on the high side, the collectors of the lateral insulated gate bipolar transistors on the low side, the anodes of the high-voltage diodes on the high side, and the cathodes of the high-voltage diodes on the low side for different channels are commonly connected to output terminals $D_o1$ to $D_on$ for the different channels, respectively. A diode other than the high-voltage diodes on the high and low sides may be connected between the emitter of each of the lateral insulated gate bipolar transistors on the high side and the corresponding output terminal.

The present embodiment makes it possible, by applying the embodiments 1 and 2 to the lateral insulated gate bipolar transistors and high-voltage diodes shown in FIG. 2 and appropriately connecting them, to reduce the size of a high-voltage output stage circuit so as to make the IC chip smaller.

What is claimed is:

1. A semiconductor device comprising:
a plurality of channels,
wherein a group of elements having a common function of the plurality of channels are enclosed in a common element isolation structure for insulated isolation from another group of elements, the another group of elements having another function and being enclose in another element isolation structure, and
wherein the group of elements is a group of diodes.

2. The semiconductor device according to claim 1, wherein cathode regions of the group of diodes enclosed in the common element isolation structure are connected to common first potential wiring.

3. The semiconductor device according to claim 2, wherein the group of diodes of mutually adjacent channels include a common cathode region.

* * * * *